United States Patent
Kim et al.

(10) Patent No.: US 8,369,676 B2
(45) Date of Patent: Feb. 5, 2013

(54) PRINTED CIRCUIT BOARD FOR OPTICAL WAVEGUIDE AND METHOD OF MANUFACTURING THE SAME

(75) Inventors: Joon Sung Kim, Gyunggi-do (KR); Han Seo Cho, Seoul (KR); Jae Hyun Jung, Gyunggi-do (KR); Sang Hoon Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 436 days.

(21) Appl. No.: 12/385,007

(22) Filed: Mar. 27, 2009

(65) Prior Publication Data

US 2010/0142883 A1    Jun. 10, 2010

(30) Foreign Application Priority Data

Dec. 9, 2008    (KR) .................. 10-2008-0124830

(51) Int. Cl.
*G02B 6/10* (2006.01)
*G02B 6/12* (2006.01)

(52) U.S. Cl. .......... 385/132; 385/14; 385/129; 385/130; 385/131

(58) Field of Classification Search .............. 385/14, 385/131, 132
See application file for complete search history.

(56) References Cited

U.S. PATENT DOCUMENTS

| | | | |
|---|---|---|---|
| 7,013,055 B2 * | 3/2006 | Hayamizu et al. | 385/14 |
| 7,801,396 B2 * | 9/2010 | Yonekura et al. | 385/14 |
| 2005/0196095 A1 * | 9/2005 | Karashima et al. | 385/14 |
| 2009/0232467 A1 * | 9/2009 | Kim et al. | 385/142 |

FOREIGN PATENT DOCUMENTS

| | | |
|---|---|---|
| JP | 08-043654 | 2/1996 |
| JP | 2002-258088 | 9/2002 |
| JP | 2002-318317 | 10/2002 |
| JP | 2006-284781 | 10/2006 |
| KR | 100834648 B1 | 5/2008 |

OTHER PUBLICATIONS

Korean Office Action issued Oct. 27, 2010 in corresponding Korean Patent Application 10-2008-0124830.
Japanese Office Action issued Jul. 26, 2011 in corresponding Japanese Patent Application 2009-054289.

* cited by examiner

*Primary Examiner* — Ryan Lepisto (57) ABSTRACT

Disclosed herein is a printed circuit board for an optical waveguide, including: a substrate; an insulation layer having a through hole and formed on the substrate; a lower clad layer formed on a bottom of the through hole; core part formed on the lower clad layer; and an upper clad layer formed on the lower clad layer and the core part and thus covering an exposed surface of the core part.

8 Claims, 10 Drawing Sheets

FIG. 1A

Prior Art

FIG. 1B

Prior Art

FIG. 1C

Prior Art

FIG. 26

PRINTED CIRCUIT BOARD FOR OPTICAL WAVEGUIDE AND METHOD OF MANUFACTURING THE SAME

CROSS REFERENCE TO RELATED APPLICATION

This application claims the benefit of Korean Patent Application No. 10-2008-0124830, filed Dec. 9, 2008, entitled "Printed circuit board for optical waveguides and method of manufacturing the same", which is hereby incorporated by reference in its entirety into this application.

BACKGROUND OF THE INVENTION

1. Field of the Invention

The present invention relates to a printed circuit board for an optical waveguide and a method of manufacturing the same, and, more particularly, to a printed circuit board which can be efficiently used to fabricate an optical waveguide using a relatively small amount of a clad material and a core material by forming a lower clad layer only in a through-hole of an insulation layer and by applying a core material only on the inner surface of the through-hole and then conducting a patterning process to form a core part, and a method of manufacturing the same.

2. Description of the Related Art

Recently, the demand for an optical substrate including optical wire enabling electrical signals and optical signals to be transmitted to mobile or network equipment has increased.

Generally, an optical wire is made of a polymer having low optical transmittance, and includes a square core part having a x-width of about 50 μm and a y-width of about 50 μm through which signals are propagated, and a clad part covering the square core part. The square core part is generally fabricated through a photo-etching process.

In relation to this, a conventional method of manufacturing a printed circuit board for an optical waveguide will be described as follows with reference to FIGS. 1A to 1C.

Figure 1A:
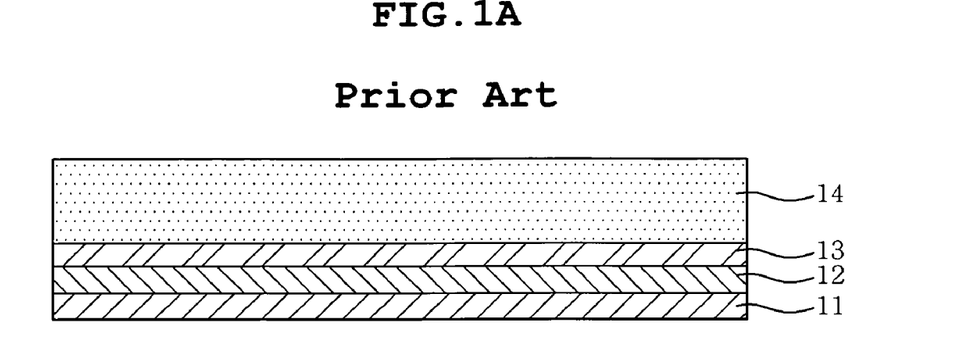
FIGS. 1A to 1C are sectional views showing a conventional method of manufacturing a printed circuit board for an optical waveguide.

First, a lower clad layer 13 and a core layer 14 are sequentially formed on a polyimide layer 12 of a flexible substrate including copper foil 11 and the polyimide layer 12 (see FIG. 1A).

Figure 1B:
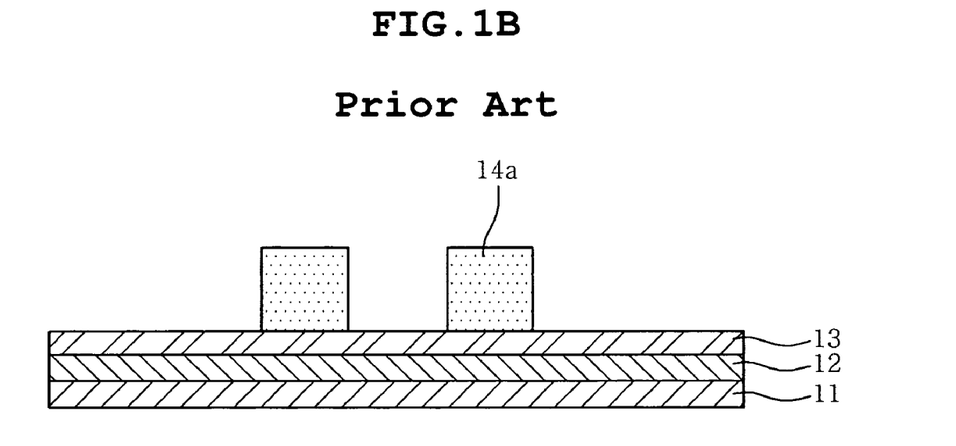

Next, the core layer 14 is patterned through a general photo-etching process to form core parts 14a (see FIG. 1B).

Figure 1C:
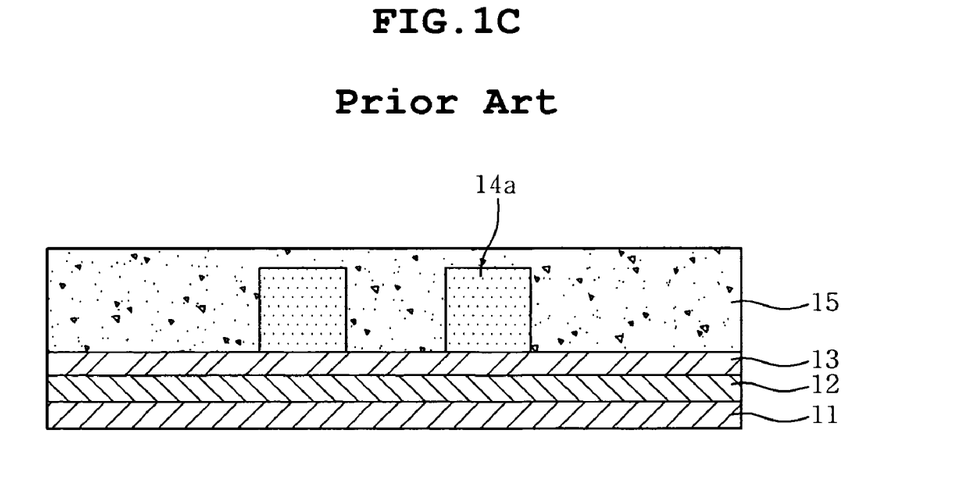

Finally, an upper clad layer 15 is formed on the lower clad layer 13 including the core parts 14a formed thereon, thus producing a printed circuit board for an optical waveguide (see FIG. 1C).

However, the conventional method of manufacturing a printed circuit board for an optical waveguide is problematic in that, since the core layer 14 is formed by applying a core material on the entire work area of the substrate and then the core layer 14 is patterned through an exposure/development process to form the core parts 14a, a very large amount of the core material is unnecessarily removed compared to the amount of actually required core parts 14a, and thus the loss of material cost is increased.

Further, the conventional method is problematic in that, since the lower and upper clad layers 13 and 15 are formed throughout the substrate although it is sufficient that they cover the core parts 14a to such a degree that the core parts 14a can easily transmit optical signals, a clad material is excessively used unnecessarily.

Therefore, considering that an optical wire is expensive, it is keenly required to manufacture an optical substrate through an economical and efficient method.

SUMMARY OF THE INVENTION

Accordingly, the present invention has been made keeping in mind the above problems occurring in the prior art, and the present invention provides a printed circuit board for an optical waveguide, which can decrease its production cost by reducing the used amount of core and clad materials, and a method of manufacturing the same.

An aspect of the present invention provides a printed circuit board for an optical waveguide, including: a substrate; an insulation layer having a through hole and formed on the substrate; a lower clad layer formed on a bottom of the through hole; core part formed on the lower clad layer; and an upper clad layer formed on the lower clad layer and the core part and thus covering an exposed surface of the core part.

In the printed circuit board, the substrate may be any one selected from among a metal layer for forming a circuit, a flexible printed circuit board, a rigid printed circuit board and a rigid-flexible printed circuit board.

Further, the substrate may include a light transmission part beneath the through hole.

Further, the insulation layer may be made of any one selected from among a thermosetting resin, a thermoplastic resin, a thermosetting resin impregnated with a reinforcing material, a thermoplastic resin impregnated with a reinforcing material, and combinations thereof.

Further, the insulation layer may include a lower insulation layer and an upper insulation layer, which have through holes corresponding to each other.

Further, the core part may be formed of a plurality of core patterns.

Further, the substrate may include a polyimide layer, and circuit patterns formed on and/or beneath the polyimide layer and transmitting electric signals.

Another aspect of the present invention provides a method of manufacturing a printed circuit board for an optical waveguide, including: forming an insulation layer having a through hole on a substrate; forming a lower clad layer on a bottom of the through hole; forming core part on the lower clad layer; and forming an upper clad layer covering the core part on the lower clad layer and the core part.

In the method, the forming of the insulation layer having the through hole may include: forming an insulation layer on a substrate; and forming a through hole in the insulation layer through an exposure/development process or a laser drilling process.

Further, the forming of the lower clad layer may include: applying a liquid lower clad material on a bottom of the through hole; flattening the applied lower clad material by placing a transparent release film thereon; and curing the flattened lower clad material by applying ultraviolet rays or heat thereto to form the lower clad layer on a bottom of the through hole.

Further, the forming of the core part may include: applying a liquid core material on the lower clad layer formed in the through hole; flattening the applied core material by placing a transparent release film thereon; selectively exposing the flattened core material using a pattern mask; and removing the transparent release film and then developing the exposed core material to form the core part.

Further, the forming of the upper clad layer may be performed through a process of applying an upper clad material on the lower clad layer and the core part and then curing the applied upper clad material or a process of placing an upper clad film on the lower clad layer and the core part.

Further, the substrate may include a polyimide layer and a metal layer formed beneath the polyimide layer, and the method may further include: patterning the metal layer to form circuit patterns after the forming of the upper clad layer.

Still another aspect of the present invention provides a method of manufacturing a printed circuit board for an optical waveguide, including: forming a lower insulation layer having a lower through hole on a substrate; forming a lower clad layer in the lower through hole; forming an upper insulation layer having an upper through hole connected with the lower through hole to thus form a single through hole on the lower insulation layer; forming core part on the lower clad layer; and forming an upper clad layer covering the core part on the lower clad layer and the core part.

In the method, the forming of the lower clad layer may include: applying a liquid lower clad material in the lower through hole; flattening the applied lower clad material by placing a transparent release film thereon; and curing the flattened lower clad material by applying ultraviolet rays or heat thereto to form the lower clad layer in the lower through hole.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the attached drawings.

Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

Figure 2A:
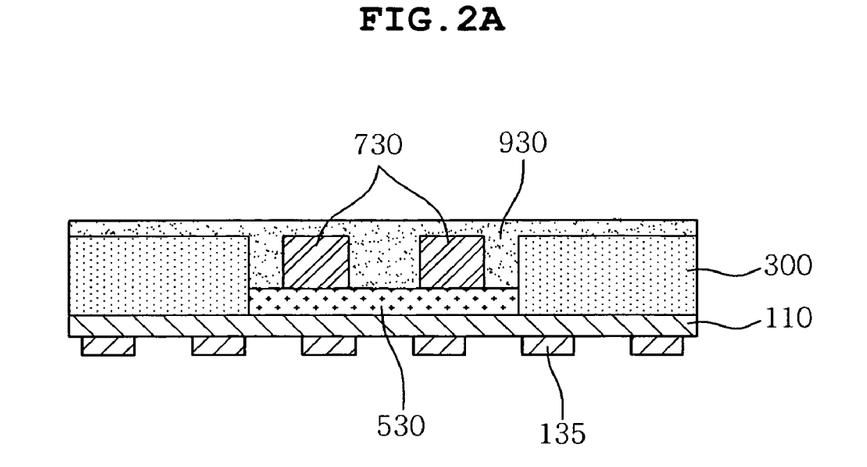
FIG. 2A is a sectional view showing a printed circuit board for an optical waveguide according to an embodiment of the present invention.
Figure 2B:
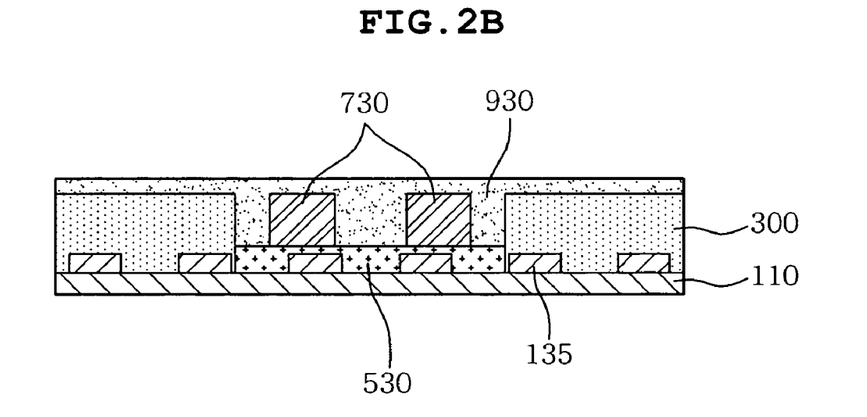
FIG. 2B is a sectional view showing a printed circuit board for an optical waveguide according to another embodiment of the present invention.

FIG. 2A is a sectional view showing a printed circuit board for an optical waveguide according to an embodiment of the present invention, and FIG. 2B is a sectional view showing a printed circuit board for an optical waveguide according to another embodiment of the present invention.

As shown in FIG. 2A, a printed circuit board for an optical waveguide according to an embodiment of the present invention includes a substrate 100, an insulation layer 300 having a thorough hole 305 (see FIG. 5) and formed on the substrate 100, and an optical waveguide.

The substrate 100 includes an insulating material layer 110 and circuit patterns 135 for electrical signal transmission formed on the insulating material layer 110. In this embodiment, a substrate 100 in which circuit patterns 135 are formed beneath an insulating material layer 110 is exemplified. However, the present invention is not limited thereto, and, as shown in FIG. 2B, a substrate in which circuit patterns 135 are formed on an insulating material layer 110 may be used, or a substrate (not shown) in which circuit patterns 135 are formed on and beneath an insulating material layer 110 may be used.

Here, the insulating material layer 110 used in the substrate 100 may be made of polyimide. However, the present invention is not limited thereto, and the insulating material layer may be formed of prepreg including an epoxy resin, which is a general insulating material. That is, the substrate may be a flexible printed circuit board, a rigid printed circuit board or a rigid-flexible printed circuit board, as is generally used for printed circuit boards.

In this case, the substrate 100 may include a light transmission part (not shown) for transmitting optical signals to/from an optical waveguide to be described later. The light transmission part has a light transmission rate of 50% or more at a wavelength of 850 nm. The light transmission part may be configured by forming the insulating material layer 110 using a transparent material, or may be intentionally formed by forming holes in the opaque insulating material layer 110.

The insulation layer 300 is formed on the substrate 100, and has a through hole 305. The through hole 305 may have a diameter of 0.5~10 nm such that an optical waveguide can be housed in the through hole 305. The insulation layer 300 may be made of any one selected from among a thermosetting resin, a thermoplastic resin, a thermosetting resin impregnated with a reinforcing material, a thermoplastic resin impregnated with a reinforcing material, and combinations thereof. For example, the insulation layer 300 may be formed of prepreg, polyimide film or a photosensitive insulating material.

The optical waveguide includes a lower clad layer 530 formed on the bottom of the thorough hole 305, core parts 730 formed on the lower clad layer 530, and an upper clad layer 930 formed on the lower clad layer 530 and the core parts 730 to cover the exposed surfaces of the core parts 730.

The lower clad layer 530 may be formed to have a thickness of 10~100 μm. The lower clad layer 530 is made of a polymer material such as an acrylic resin, an epoxy resin, a polyimide resin, a fluorinated acrylic resin, a fluorinated polyimide resin or the like.

The core parts 730 are formed on the lower clad layer 530 in the through hole 305. The height of each of the core parts 730 based on the substrate 100 may be equal to, lower than or higher than that of the insulation layer 300. The core parts 730 are interposed between the lower clad layer 530 and the upper clad layer 930, and function as channels for transmitting optical signals. The core parts 730 are also made of a polymer material similar to that of the upper clad layer 930 or the lower clad layer 530, and have a refractive index higher than that of the upper clad layer 930 or the lower clad layer 530 in order to efficiently transmit optical signals. As shown in drawings, the core parts 730 may be formed of a plurality of core patterns.

The upper clad layer 930 is formed on the lower clad layer 530 and the core parts 730 to cover the exposed surfaces of the core parts 730, and is made of a material the same as or similar to that of the lower clad layer 530. As shown in FIG. 2A, the upper clad layer 930 is configured such that it is charged in the through hole 305 and covers the insulation layer 300. However, the present invention is not limited thereto, and, as shown in FIG. 3A, the upper clad layer 930 may be configured such that it is only charged in the through hole 305, similar to the lower clad layer 530.

The above-mentioned printed circuit board can transmit electrical signals through the circuit patterns 135 formed in the substrate 100, and can transmit optical signals through the optical waveguide. In this case, optical signals are incident on the core parts 730 through the light transmission part formed in the substrate 100, and are then totally reflected by the lower clad layer 530 and the upper clad layer 930 and simultaneously transmitted along the core parts 730. The optical signals are reflected by a mirror (not shown) and then go outside.

Figure 3A:
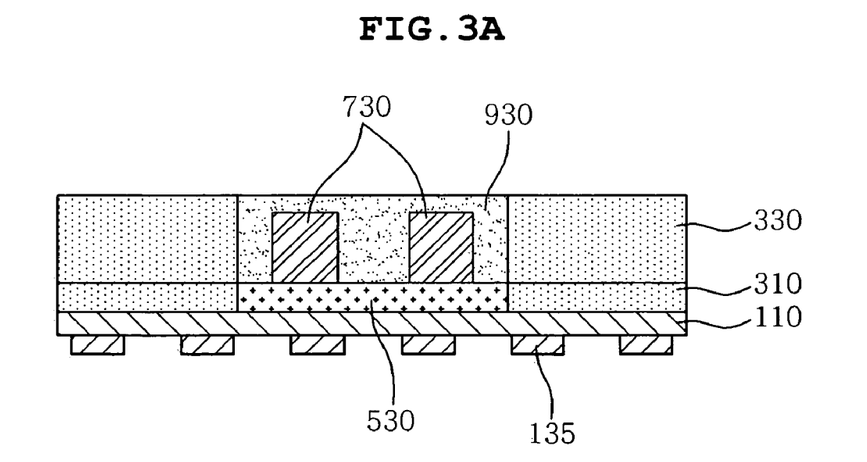
FIG. 3A is a sectional view showing a printed circuit board for an optical waveguide according to another embodiment of the present invention.
Figure 3B:
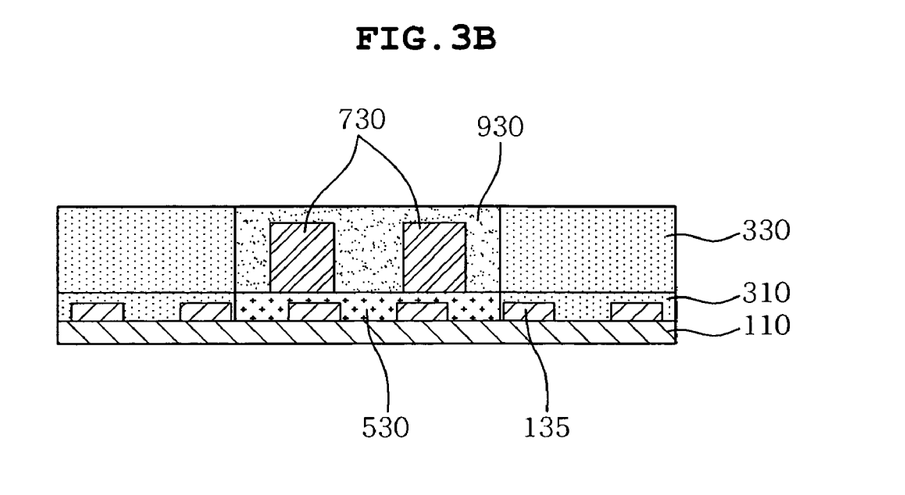
FIG. 3B is a sectional view showing a printed circuit board for an optical waveguide according to another embodiment of the present invention.

FIG. 3A is a sectional view showing a printed circuit board for an optical waveguide according to another embodiment of the present invention, and FIG. 3B is a sectional view showing a printed circuit board for an optical waveguide according to another embodiment of the present invention. Here, the description overlapping with the above embodiment will be omitted.

As shown in FIG. 3A, a printed circuit board for an optical waveguide according to another embodiment of the present invention includes a substrate 100, an insulation layer 310 and 330 having a thorough hole 315 or 335 (see FIGS. 16 and 20) and formed on the substrate 100, and an optical waveguide.

In this embodiment, the insulation layer includes a lower insulation layer 310 and an upper insulation layer 330, which have through-holes corresponding to each other. The lower insulation layer 310 may have a thickness of 10~100 μm, and the upper insulation layer 330 may have a thickness of 10~200 μm.

The substrate of this embodiment may also include circuit patterns 135 thereon, as shown in FIG. 3B. In this case, the lower clad layer 530 functions as a general insulation layer 300 with respect to the circuit patterns 135.

Meanwhile, in this embodiment, the upper clad layer 930 is charged in only the through hole 315 or 335, but the present invention is not limited thereto. A part of the upper clad layer 930 covering the core parts 730 may be extended onto the insulation layer 300 (see FIG. 2A).

In the above-mentioned printed circuit board, since at least one of the lower clad layer 530 and the upper clad layer 930 is formed in the through hole, the amount of a clad material used can be reduced, thus decreasing the production cost thereof.

FIGS. 4 to 14 are sectional views showing a process of manufacturing a printed circuit board for an optical waveguide according to an embodiment of the present invention. Hereinafter, the process of manufacturing a printed circuit board for an optical waveguide according to an embodiment of the present invention will be described with reference to FIGS. 4 to 14.

Figure 4:
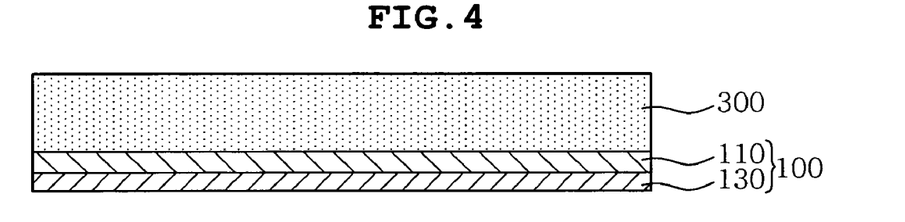
FIGS. 4 to 14 are sectional views showing a process of manufacturing a printed circuit board for an optical waveguide according to an embodiment of the present invention.
Figure 5:
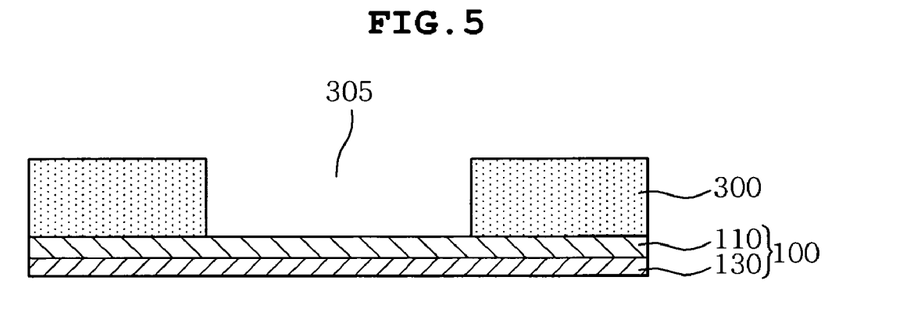

First, a process of forming an insulation layer 300 having a through hole 305 on a substrate 100 will be described.

As shown in FIG. 4, when a substrate 100 is provided, an insulation layer 300 is formed on the substrate 100. The substrate 100 is composed of an insulating material layer 110 and a metal layer 130 formed on one side of the insulating material layer 110. In this embodiment, a flexible copper clad laminate in which copper foil is applied on one side of the insulating material layer 110 made of polyimide is used as the substrate 100, but the present invention is not limited thereto. The metal layer 130 for forming circuits, such as copper foil, may be directly used as the substrate 100. Further, if necessary, other flexible copper clad laminates, rigid copper clad laminates and rigid-flexible copper clad laminates, which are generally used in printed circuit boards, may be selectively used as the substrate 100. Furthermore, other flexible copper clad laminates, rigid copper clad laminates and rigid-flexible copper clad laminates, in which one or more circuit layers are previously formed, may be selectively used as the substrate 100.

The insulation layer 300 may be made of any one selected from among a thermosetting resin, a thermoplastic resin, a thermosetting resin impregnated with a reinforcing material, a thermoplastic resin impregnated with a reinforcing material, and combinations thereof. Examples of the insulation layer 300 may include, but may be not limited to, prepreg, polyimide film and a photosensitive insulating material.

Subsequently, as shown in FIG. 5, a through hole 305 is formed in the insulation layer 300. Methods of forming the through hole 305 in the insulation layer 300 are not particularly limited, and may be suitably selected depending on the kind of an insulating material constituting the insulation layer 300. For example, the through hole 305 may be formed through a photo-etching process using exposure/development, a laser machining process, or the like.

Figure 6:
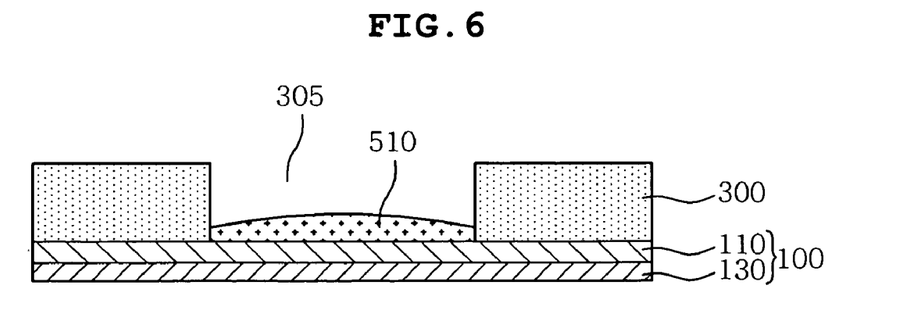

Next, a process of forming a lower clad layer 530 on the bottom of the through hole 305 will be described.

As shown in FIG. 6, a liquid lower clad material 510 is applied on the bottom of the through hole 305. The liquid lower clad material 510 is charged in the through hole 305 through a method well known to those skilled in the art, such as a dispensing method, an ink jetting method, a printing method or the like.

Figure 7:
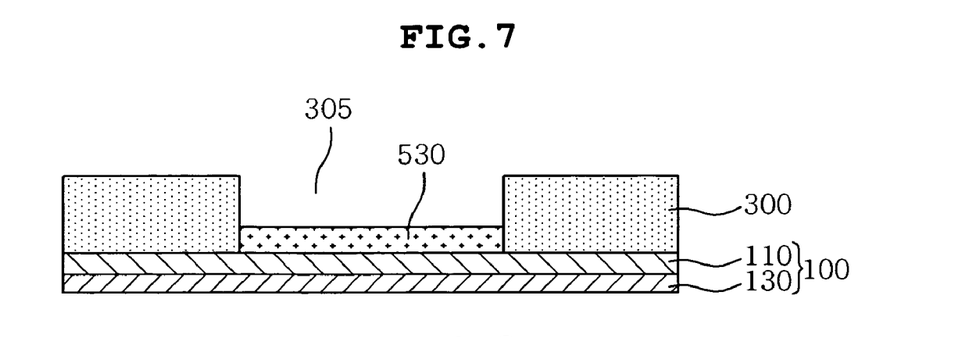

Subsequently, as shown in FIG. 7, the liquid lower clad material 510 is flattened by placing a transparent release film 800 thereon, and is then cured by applying ultraviolet rays or heat to the flattened liquid lower clad material 510 to form a lower clad layer 530 on the bottom of the through hole 305.

In this case, the process of flattening the liquid lower clad material 510 is not an essential process but an optional process performed only when the surface of the lower clad material 510 is curved. In particular, the lower clad layer 530 may be formed by laminating a clad material film, and, in this case, the process of flattening the liquid lower clad material 510 may not be performed.

Figure 8:
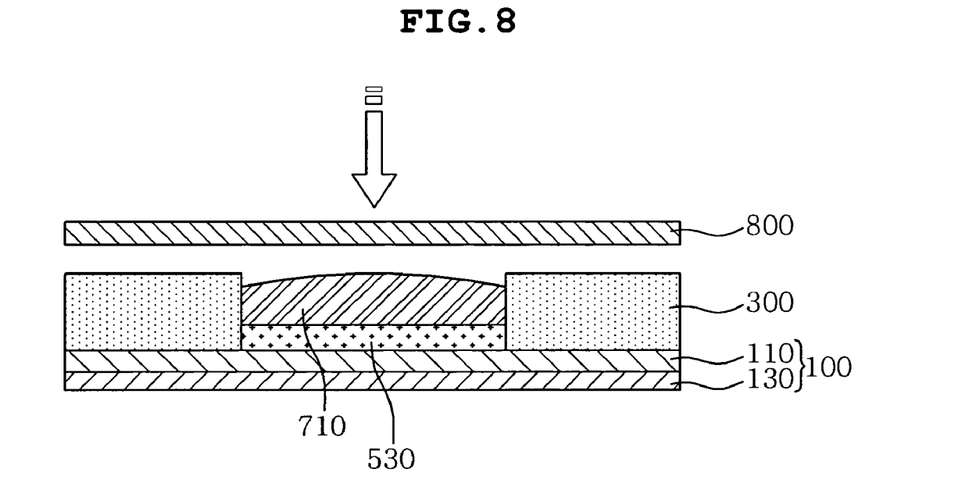

Next, a process of forming core parts 730 on the lower clad layer 530 will be described.

As shown in FIG. 8, a liquid core material 710 is applied on the lower clad layer 530 formed in the through hole 305. The liquid core material 710 is charged in the through hole 305 through a method well known to those skilled in the art, such as a dispensing method, an ink jetting method, a printing method or the like, and is then pre-baked. In this case, the liquid core material 710 can be fully charged in the through hole 305, but may not be fully charged in the through hole 305. Further, a large amount of the liquid core material greater than the volume of the through hole 305 may be charged in the through hole 305 because of the surface tension of the liquid core material 710, thus determining the height of the core parts 730 (core patterns) to be formed later.

Subsequently, in order to apply a general exposure process, the liquid core material 710 is flattened by placing a transparent release film 800 thereon. That is, the liquid core material 710 is flattened by placing the transparent release film 800 thereon under vacuum conditions. All types of transparent release film 80 may be used without limitation as long as it enables the liquid core material 710 to be flattened while preventing the liquid core material 710 from being polluted by impurities, it enables the permeation of light in a subsequent exposure process, and it can be easily removed after the exposure process. Even in this case, the process of flattening the liquid core material 710 is not an essential process but an optional process performed only when the surface of the liquid core material 710 is curved. Further, in this case, in addition to the liquid core material 710, a core material film 710 can be laminated.

Figure 9:
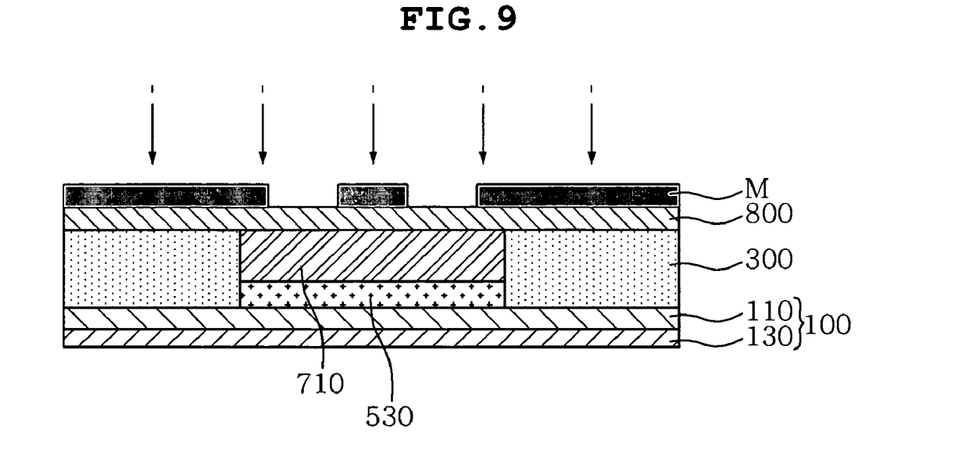

Subsequently, as shown in FIG. 9, the core material 710 is selectively exposed using a pattern mask (M). In this case, if necessary, post exposure baking (PEB) may be performed before or after the exposure of the core material 710.

Figure 10:
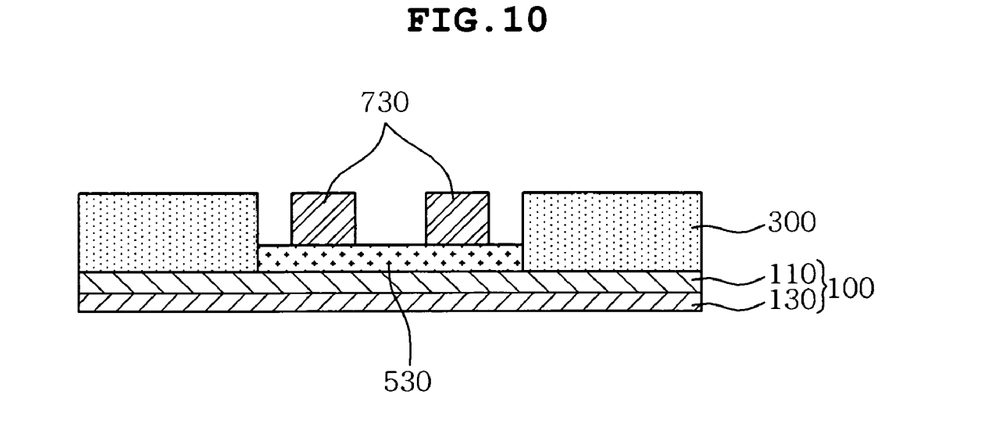

Subsequently, as shown in FIG. 10, the transparent release film 800 is removed, and then the exposed core material 710 is developed to form core parts 730.

Meanwhile, in this embodiment, a process of forming the core parts 730 through exposure and development is described, but the core parts 730 may be formed through laser etching. That is, core parts can be formed by applying a liquid core material on the lower clad layer formed in the through hole and then applying ultraviolet (UV) rays or heat to the applied liquid core material to cure the core material and then patterning the cured core material using a laser. At the time of pattering the cured core material, the cured core material may be selectively etched using an eximer laser, a YAG laser or a $CO_2$ laser while controlling the number of laser pulses and shots.

Further, the core parts 730 may be formed using a process of changing the refractive index of the core material using ultraviolet (UV) rays and a mask or a process of changing the refractive index of the core material using a laser.

Figure 11:
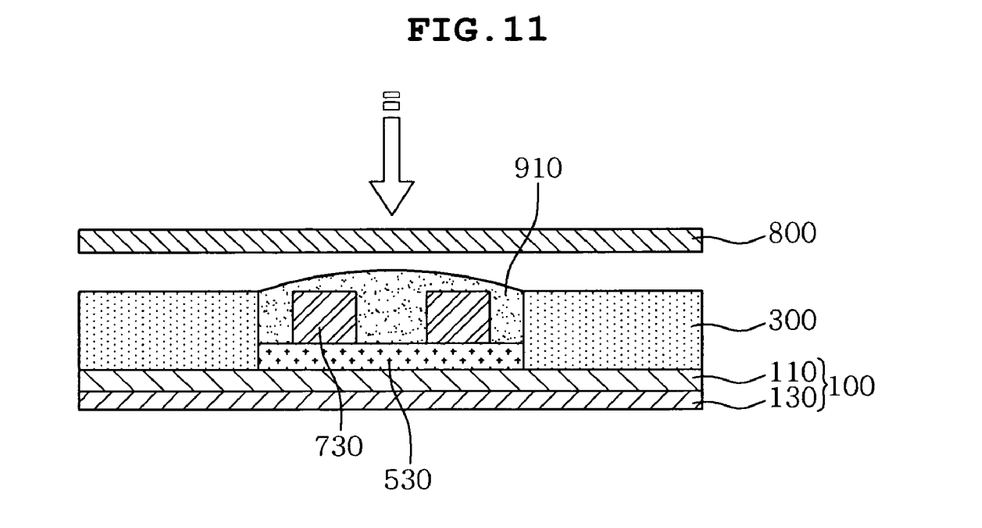

Next, a process of forming an upper clad layer 930 covering the core parts 730 on the lower clad layer 530 and the core parts 730 will be described.

Figure 12A:
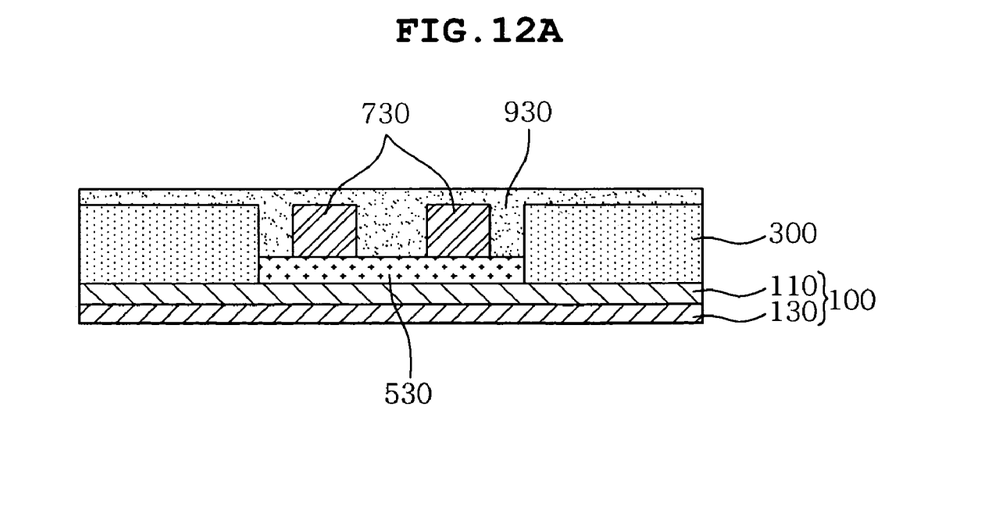
Figure 12B:
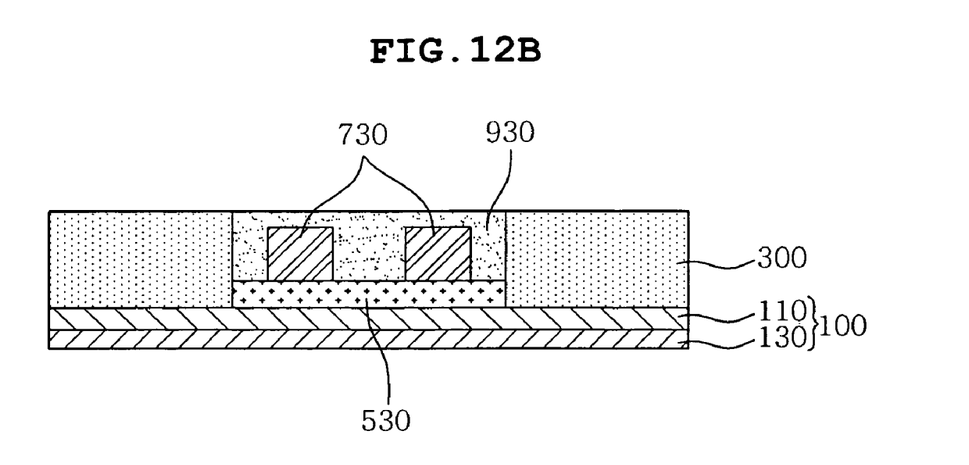

As shown in FIG. 11, the upper clad layer 930 may be formed by applying an upper clad material 910 on the lower clad layer 530 and the core parts 730 and then curing the applied upper clad material 910 or by placing an upper clad film on the lower clad layer 530 and the core-parts 730. In this case, as shown in FIG. 12A, the upper clad layer 930 may be formed such that it covers both the core parts 730 and the insulation layer 300, and, as shown in FIG. 12B, the upper clad layer 930 may be formed only in the through hole 305 such that it covers only the core parts 730.

Figure 13:
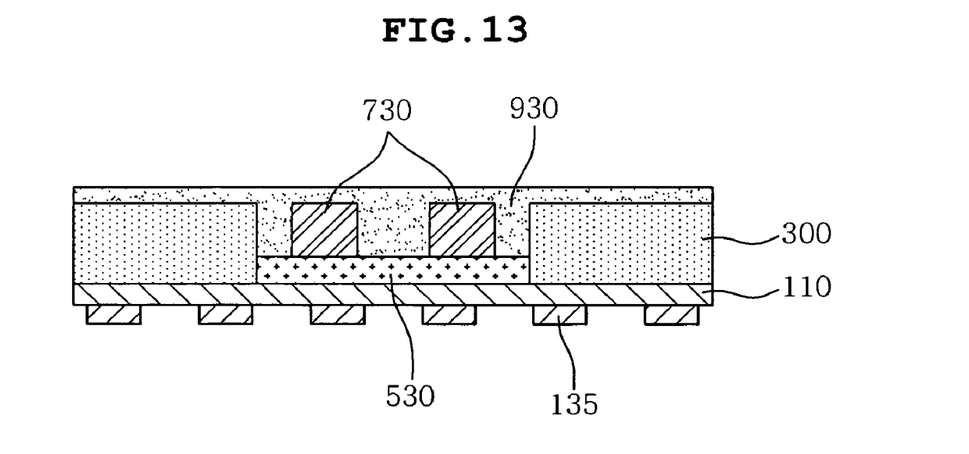
Figure 14:
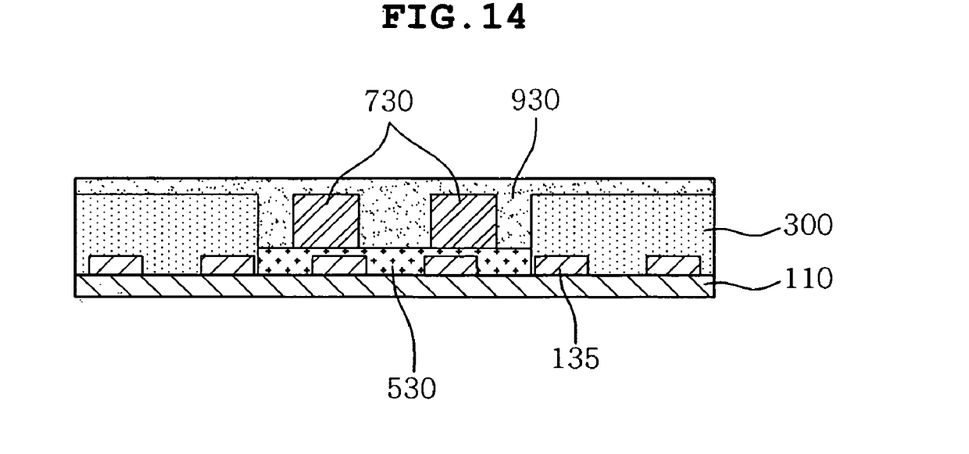

Subsequently, as shown in FIG. 13, circuit patterns 135 are formed by patterning the metal layer 130. This process is performed only when a substrate 100 in which a metal layer 130 is formed beneath an insulating material layer 110 is used, but this process may be omitted when a substrate 100 in which circuit patterns 135 are formed on an insulating material layer 110 is used as shown in FIG. 14.

FIGS. 15 to 26 are sectional views showing a process of manufacturing a printed circuit board for an optical waveguide according to another embodiment of the present invention. Hereinafter, the process of manufacturing a printed circuit board for an optical waveguide according to another embodiment of the present invention will be described with reference to FIGS. 15 to 16. Here, the description overlapping with the above embodiment will be omitted.

Figure 15:
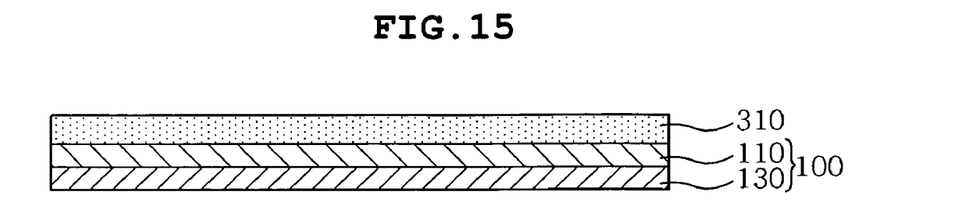
FIGS. 15 to 26 are sectional views showing a process of manufacturing a printed circuit board for an optical waveguide according to another embodiment of the present invention.
Figure 16:
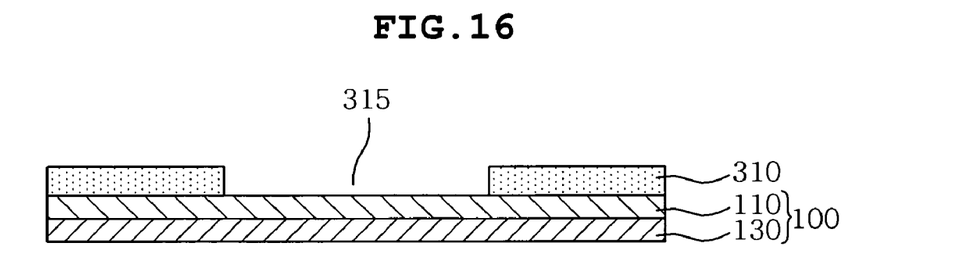

First, a process of forming a lower insulation layer 310 having a lower through hole 315 on a substrate 100 will be described.

As shown in FIG. 15, when a substrate 100 is provided, a lower insulation layer 310 having a thickness of 10~100 μm is formed on the substrate 100.

Subsequently, as shown in FIG. 16, a lower through hole 315 is formed in the lower insulation layer 310.

Figure 17:
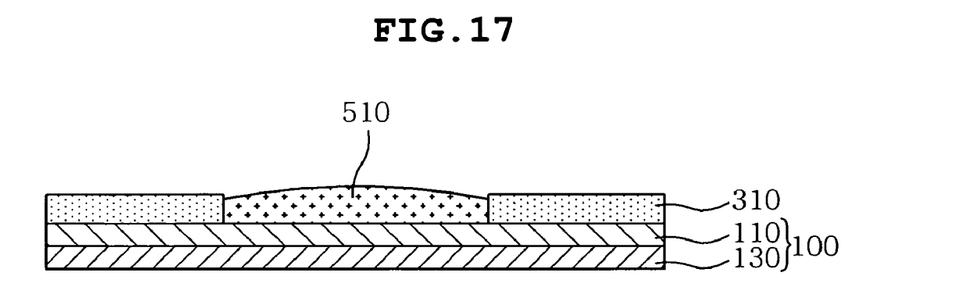

Subsequently, a lower clad layer 530 is formed on the lower through hole 315.

Figure 18:
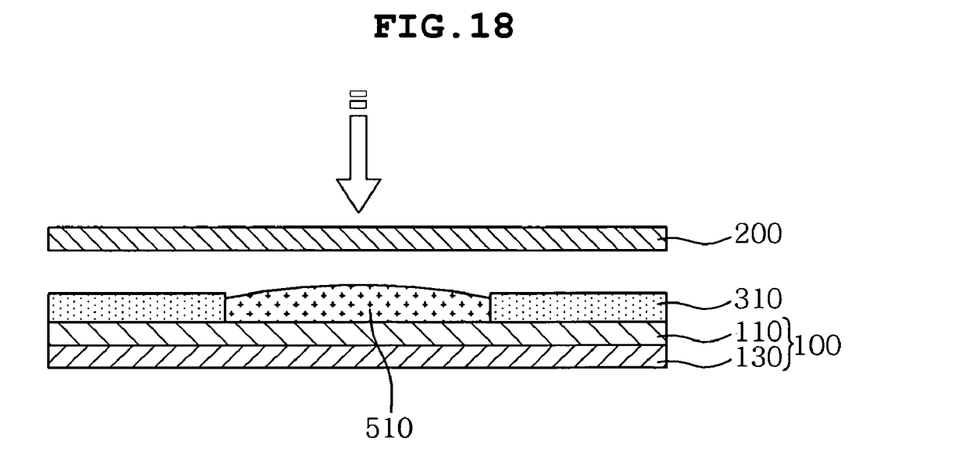
Figure 19:
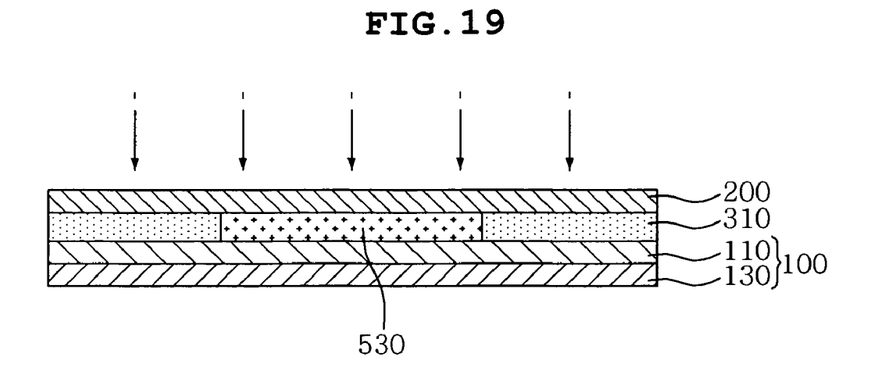

As shown in FIG. 17, a liquid lower clad material 510 is applied in the lower through hole 315. Subsequently, as shown in FIG. 18, the applied liquid lower clad material 510 is flattened by placing a transparent release film 200 thereon. Subsequently, as shown in FIG. 19, the flattened liquid lower clad material 510 is cured by applying ultraviolet rays or heat thereto to form a lower clad layer 530 in the lower through hole 315. In this case, the process of flattening the applied liquid lower clad material 510 using the transparent release film 200 is not an essential process but an optional process.

Figure 20:
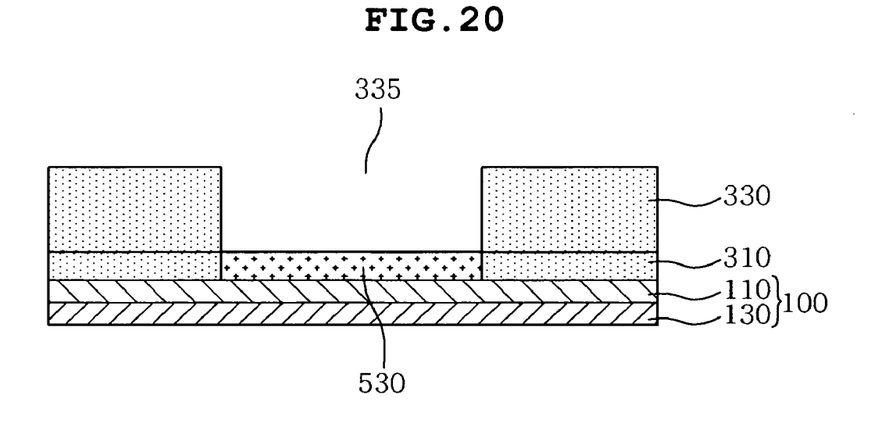

Subsequently, as shown in FIG. 20, an upper insulation layer 330 having an upper through hole 335 connected with the lower through hole 315 and thus formed into a single through hole is formed on the lower insulation layer 310. The upper through hole 335 and the lower through hole 315 may be exactly matched with each other, but they may also be connected with each other within an allowable error.

The upper insulation layer 330 may be made of any one selected from among a thermosetting resin, a thermoplastic resin, a thermosetting resin impregnated with a reinforcing material, a thermoplastic resin impregnated with a reinforcing material, and combinations thereof. Examples of the upper insulation layer 330 may include prepreg, polyimide film, a photosensitive insulating material, and the like. Methods of forming the upper through hole 335 in the upper insulation layer 330 are not particularly limited, and may be suitably selected depending on the kind of upper insulating material constituting the insulation layer 330. For example, the upper through hole 335 may be formed through a photo-etching process using exposure/development, a laser machining process, or the like.

Figure 21:
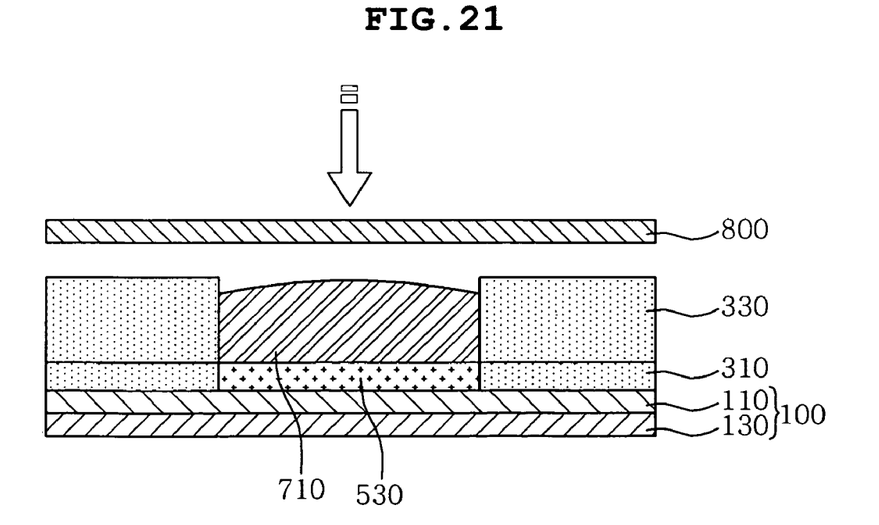
Figure 22:
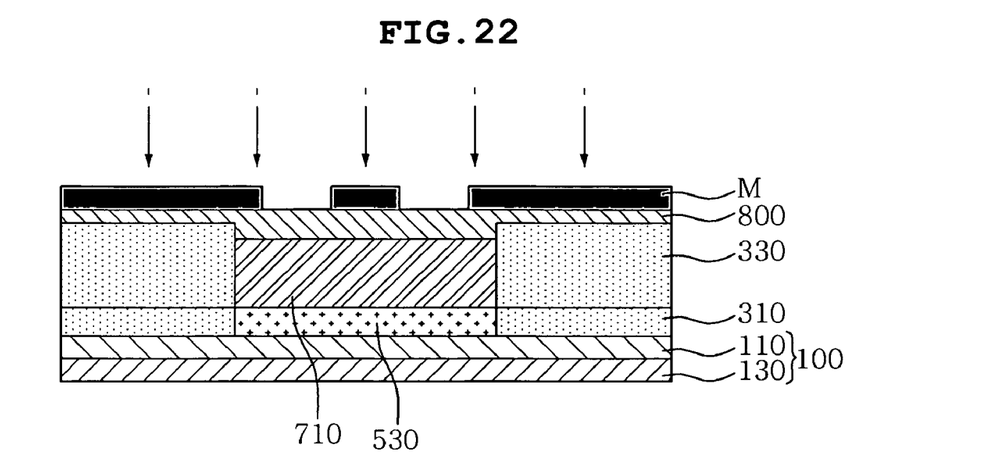

Next, a process of forming core parts 730 on the lower clad layer 530 will be described.

As shown in FIGS. 21 and 22, the core parts 730 are formed by charging a core material 710 in the upper through hole 335, flattening the charged core material 710 and then selectively exposing and developing the flattened core material 710. Since the process of forming the core parts 730 in this embodiment is the same as or very similar to that in the above embodiment, it is not described in detail.

Figure 23:
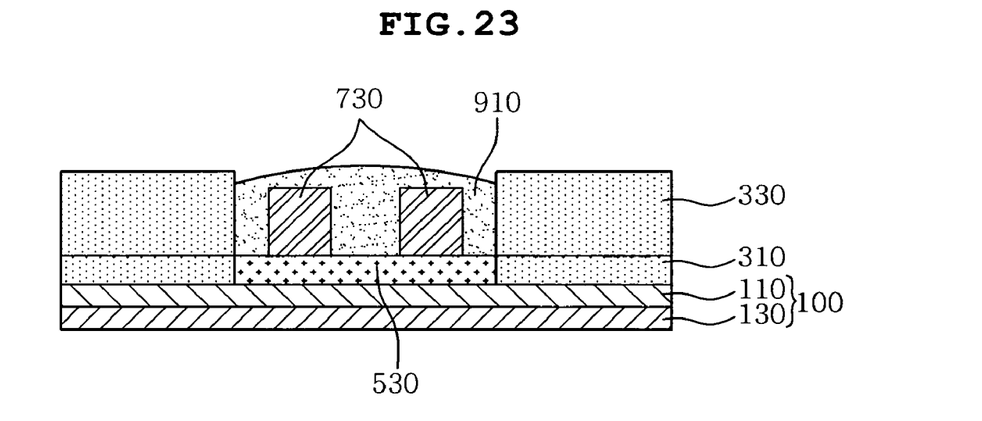

Next, a process of forming an upper clad layer 930 covering the core parts 730 on the lower clad layer 530 and the core parts 730 will be described.

Figure 24A:
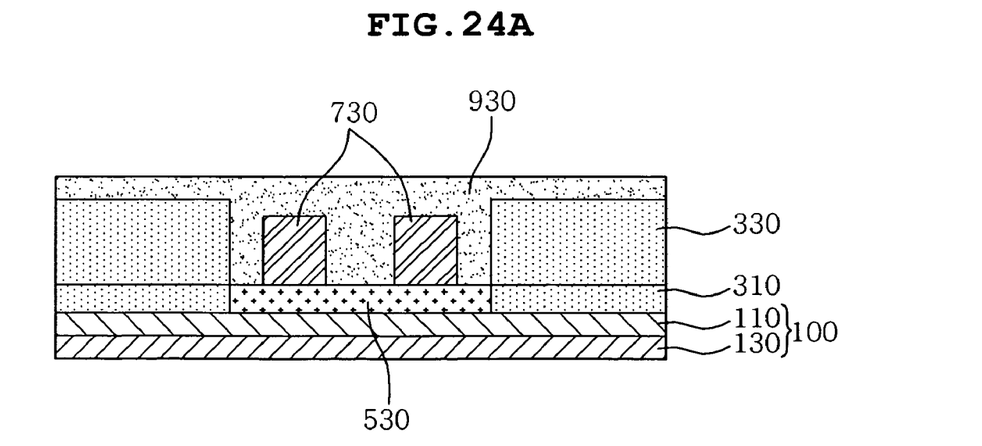
Figure 24B:
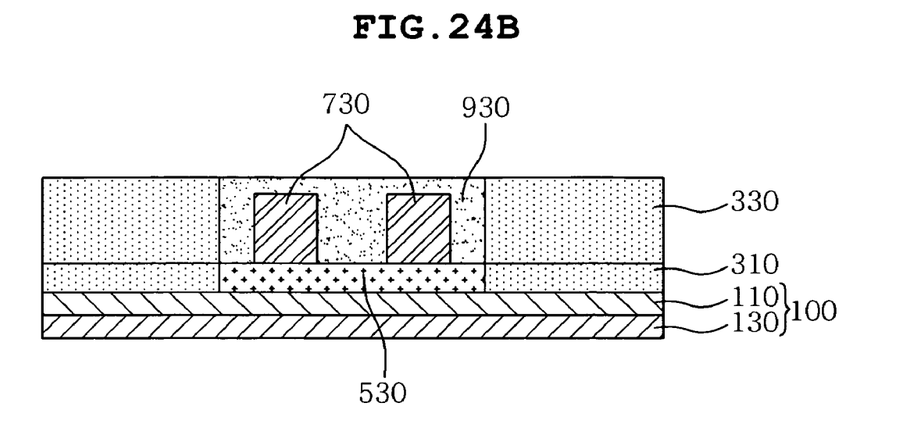

As shown in FIG. 23, the upper clad layer 930 may be formed by applying an upper clad material 910 on the lower clad layer 530 and the core parts 730 and then curing the applied upper clad material 910 or by disposing an upper clad film on the lower clad layer 530 and the core parts 730. In this case, as shown in FIG. 24A, the upper clad layer 930 may be formed such that it covers both the core parts 730 and the upper insulation layer 330, and, as shown in FIG. 24B, the upper clad layer 930 may be formed only in the upper through hole 335 such that it covers only the core parts 730.

Figure 25:
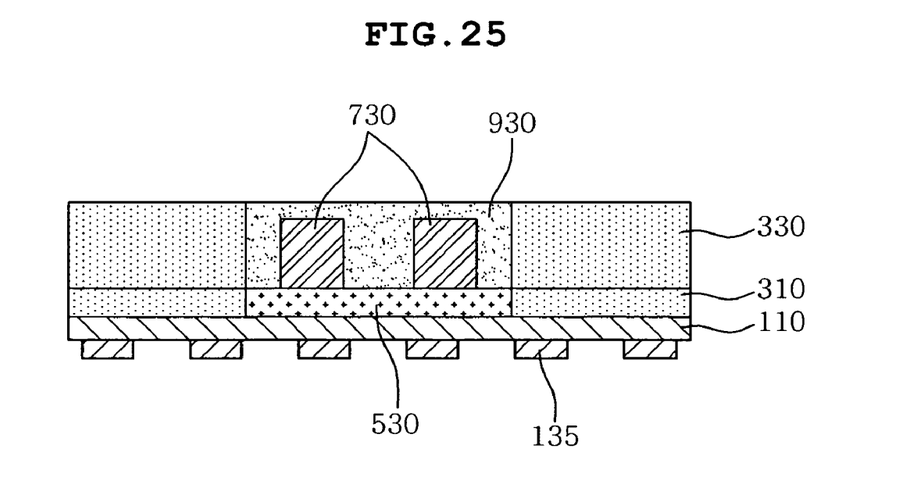
Figure 26:
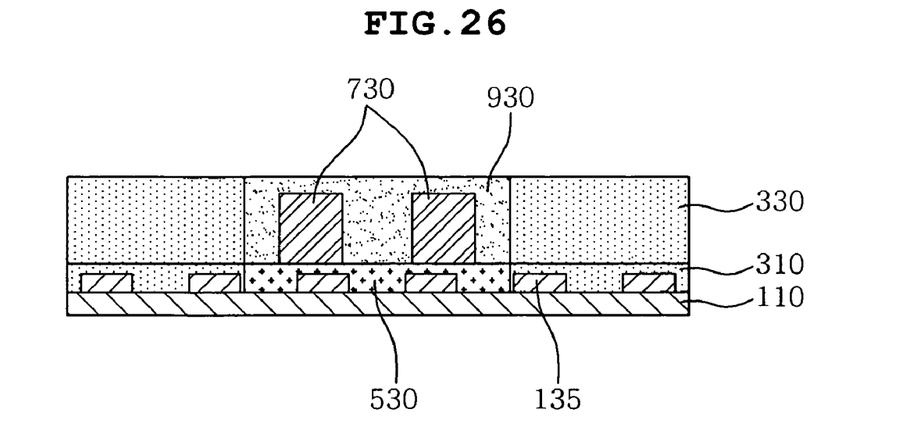

Subsequently, as shown in FIG. 25, circuit patterns 135 are formed by patterning the metal layer 130. This process is performed only when a substrate 100 in which a metal layer 130 is formed beneath an insulating material layer 110 is used, but this process may be omitted when a substrate 100 in which circuit patterns 135 are formed on an insulating material layer 110 is used as shown in FIG. 26.

As described above, according to the present invention, when an optical waveguide is formed on a substrate 100, first, an insulation layer 300 having a through hole 305 is formed, and then a core material 710 is charged only in the through hole 305 and then patterned to form core parts 730, so that the used amount of the core material 710 in the present invention is reduced to about 1/10~1/50 of the used amount of the core material 710 in a conventional technology, thereby increasing economic efficiency.

Further, according to the present invention, since a lower clad layer 530 is formed only in a through hole 305 of an insulation layer 300, the amount of a clad material used to form the lower clad layer 530 can be reduced.

Moreover, according to the present invention, since a member having a through hole for forming cores and a transparent release film 800 are selectively used, more precise and fine core parts 730 can be formed, the core parts 730 can be flattened, and the deterioration of optical properties attributable to the pollution caused by impurities can be prevented, so that a highly-reliable printed circuit board for an optical waveguide can be efficiently manufactured.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board for an optical waveguide, comprising:
    a substrate;
    an insulation layer having a through hole and formed on the substrate;
    a lower clad layer formed on a bottom of the through hole;
    a core part formed on the lower clad layer and the inside of the through hole of the insulation layer; and
    an upper clad layer formed on the lower clad layer, the core part and the inside of the through hole of the insulation layer and thus covering an exposed surface of the core part.

2. The printed circuit board for an optical waveguide according to claim 1, wherein the substrate is any one selected from among a metal layer for forming a circuit, a flexible printed circuit board, a rigid printed circuit board and a rigid-flexible printed circuit board.

3. The printed circuit board for an optical waveguide according to claim 1, wherein the substrate includes a light transmission part beneath the through hole.

4. The printed circuit board for an optical waveguide according to claim 1, wherein the insulation layer is made of any one selected from among a thermosetting resin, a thermoplastic resin, a thermosetting resin impregnated with a reinforcing material, a thermoplastic resin impregnated with a reinforcing material, and combinations thereof.

5. The printed circuit board for an optical waveguide according to claim 1, wherein the insulation layer includes a lower insulation layer and an upper insulation layer, which have through holes corresponding to each other.

6. The printed circuit board for an optical waveguide according to claim 1, wherein the core part are formed of a plurality of core patterns.

7. The printed circuit board for an optical waveguide according to claim 1, wherein the substrate includes a polyimide layer, and circuit patterns formed on and/or beneath the polyimide layer and transmitting electric signals.

8. The printed circuit board for an optical waveguide according to claim 1, wherein the upper clad layer is charged in the through hole and covers the insulation layer.

* * * * *